United States Patent
Hoefler et al.

(10) Patent No.: US 8,254,186 B2
(45) Date of Patent: Aug. 28, 2012

(54) CIRCUIT FOR VERIFYING THE WRITE ENABLE OF A ONE TIME PROGRAMMABLE MEMORY

(75) Inventors: Alexander B. Hoefler, Austin, TX (US); Mohamed S. Moosa, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 302 days.

(21) Appl. No.: 12/771,209

(22) Filed: Apr. 30, 2010

(65) Prior Publication Data

US 2011/0267869 A1    Nov. 3, 2011

(51) Int. Cl.
*G11C 7/22* (2006.01)

(52) U.S. Cl. ............... 365/189.16; 365/225.7; 365/96; 365/228; 365/194; 365/195

(58) Field of Classification Search ......... 365/96, 365/100, 148, 163, 189.16, 225.7, 228, 193, 365/194, 195
See application file for complete search history.

(56) References Cited

U.S. PATENT DOCUMENTS

| | | | |
|---|---|---|---|
| 5,418,746 A | 5/1995 | Choi | |
| 6,826,089 B2 * | 11/2004 | Jung | 365/189.05 |
| 7,672,153 B2 | 3/2010 | Plants | |
| 2004/0264268 A1 | 12/2004 | Fukumoto | |
| 2006/0267653 A1 | 11/2006 | Fulkerson | |
| 2008/0042234 A1 | 2/2008 | Yamaguchi | |
| 2008/0068910 A1 | 3/2008 | Jao | |
| 2009/0310266 A1 | 12/2009 | Etherton et al. | |

FOREIGN PATENT DOCUMENTS

WO    2009151676 A2    12/2009

OTHER PUBLICATIONS

PCT Application No. PCT/US2011/032739, International Search Report and Written Opinion, dated Apr. 15, 2011.

* cited by examiner

*Primary Examiner* — Andrew Q Tran

(57) ABSTRACT

A memory system including a one time programmable (OTP) memory is provided. The memory system further includes a write enable verification circuit including an asymmetric inverter stage and a symmetric inverter stage coupled at a node. The write enable verification circuit is configured to receive a write enable signal. When the write enable signal changes from a first voltage level to a second voltage level, a voltage at the node changes at a first rate and wherein when the write enable signal changes from the second voltage level to the first voltage level, the voltage at the node changes at a second rate higher than the first rate. The write enable verification circuit is further configured to generate a verified write enable signal for enabling programming of the OTP memory.

20 Claims, 3 Drawing Sheets

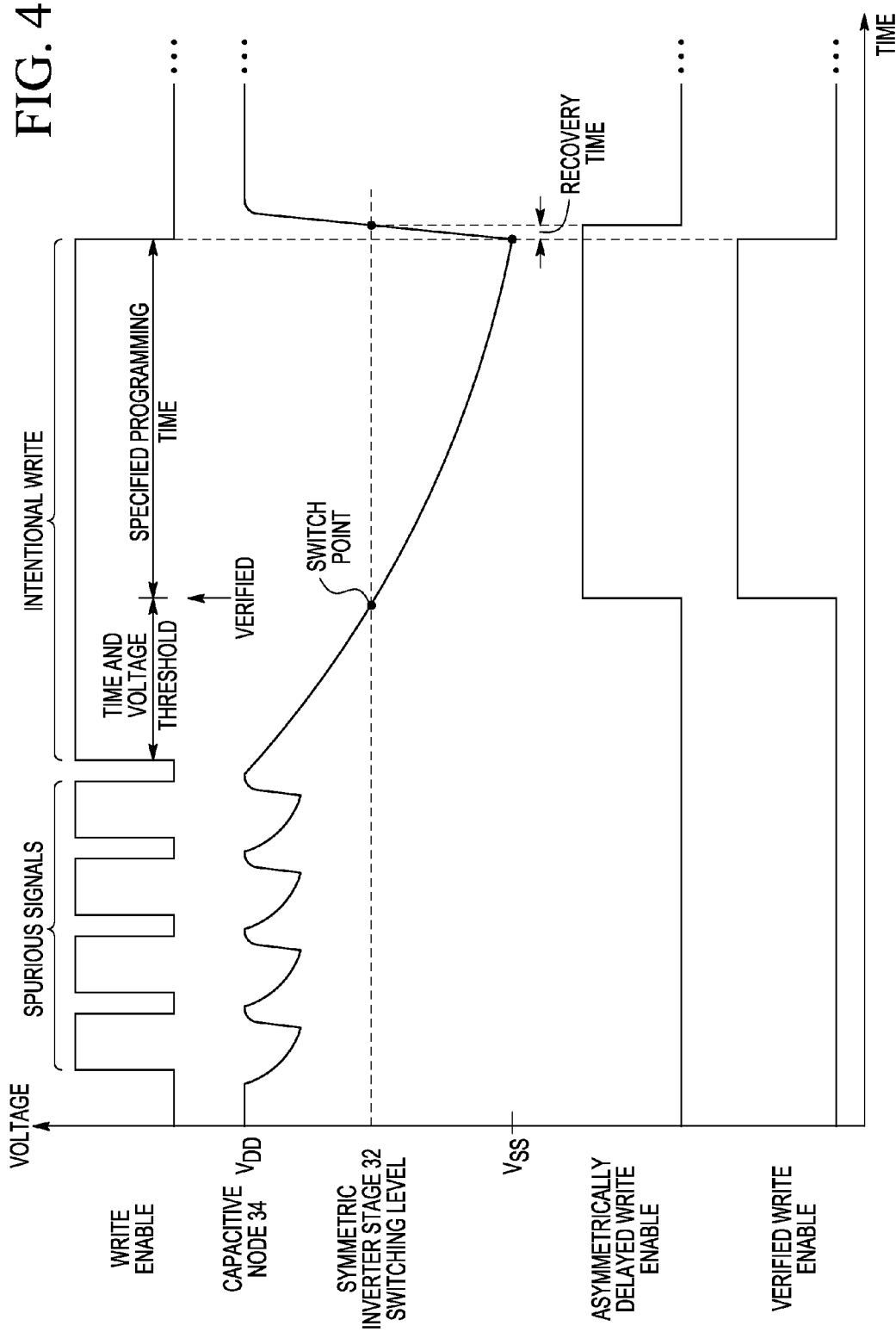

CIRCUIT FOR VERIFYING THE WRITE ENABLE OF A ONE TIME PROGRAMMABLE MEMORY

BACKGROUND

1. Field

This disclosure relates generally to semiconductors, and more specifically, to semiconductor circuits which use one time programmable memories.

2. Related Art

A category of memory devices in semiconductor technology is known as one time programmable (OTP) memory. There are various known instantiations of an OTP memory element including an electrical fuse or eFuse. eFuses are generally programmed by forcing a large electrical current through them. The high current is intended to alter the eFuse structure which results in a high resistance state. For conventional eFuse programming, the eFuse structure to be programmed is typically selected by a decoded address which is generated by a controller circuit.

With conventional eFuses, there is a risk that the eFuse may be inadvertently programmed by spurious signals. Such spurious signals may originate from a variety of sources, such as during a circuit power up, during testing and from radiation induced upsets. There is also a risk that the eFuses are falsely programmed during a circuit power cycle when it is possible that the control circuit of a matrix of eFuses is in an undefined state due to power sequencing issues. As a result, if the controller issues short, erroneous signals, the eFuse array may be briefly driven into a write state. In this state, inadvertent programming of one or more eFuses will occur. Additionally, users of products are instructed to avoid certain system operating conditions which can inadvertently program an eFuse. However, various customer systems use operating conditions which nonetheless create inadvertent programming of eFuses.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 illustrates in graphical form timing signals associated with an exemplary operation of the memory system of FIG. 1.

DETAILED DESCRIPTION

Figure 1:
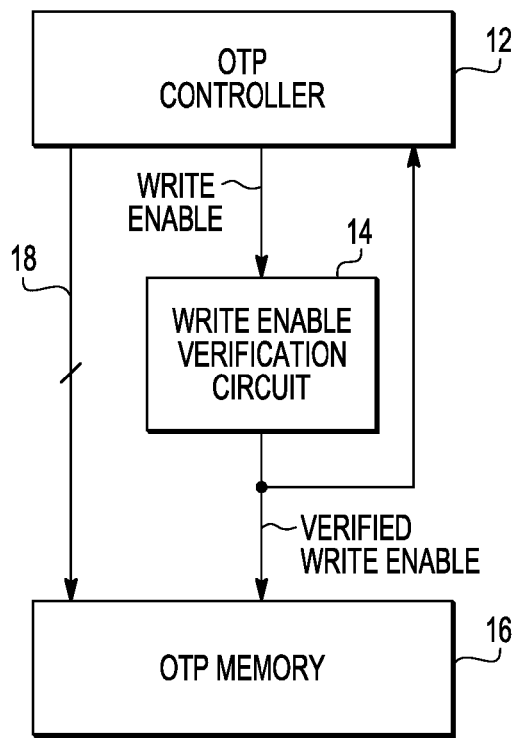
FIG. 1 illustrates in block diagram form a memory system having a one time programmable memory and controller in accordance with principles of the present invention.

Illustrated in FIG. 1 is a memory system 10 generally having an OTP controller 12, a write enable verification circuit 14 and an OTP memory 16. In one form the memory system 10 may be implemented on a single integrated circuit. In other forms the memory system 10 may be implemented using two or more integrated circuits. The OTP controller 12 has a Write Enable (WE) signal that is connected to an input of a write enable verification circuit 14. An output of the write enable verification circuit 14 provides a verified write enable signal and is connected to a first input of the OTP memory 16 and to an input of an OTP controller 12. A second output of the OTP controller 12 provides other signals 18, such as an address signal and control signals, and is connected to a second input of the OTP memory 16.

In operation, the OTP controller 12 controls the accessing to the OTP memory 16 including the programming of one time programmable memory within the OTP memory 16. The OTP controller 12 provides a Write Enable signal to the write enable verification circuit 14 when it is desired to program one of the one time programmable memories within OTP memory 16. The write enable verification circuit functions to determine whether the write enable signal is a valid write enable signal by verifying that the write enable signal has a sufficiently long time duration. In response to the verification, the write enable verification circuit 14 provides a verified write enable signal to both the OTP memory 16 and back to the OTP controller 12. The verified write enable signal lets the OTP controller 12 know that a write enable has been confirmed to be a valid write enable signal and enables the OTP controller 12 to assert the write enable signal for a remaining predetermined amount of time which is a specified programming time. The specified programming time is predetermined and is an amount of time which is optimized to accurately program a one time programmable memory element within the OTP memory 16. In response to receiving the verified write enable signal, the OTP controller 12 will assert the write enable for the predetermined amount of time. Once the write enable is no longer asserted, the write enable verification circuit 14 will no longer assert the verified write enable signal to the OTP memory 16 and the OTP controller 12. While the verified write enable signal is asserted, the OTP memory 16 uses the other signals 18, which include an address to an OTP memory element within the OTP memory 16, to program a memory element within the OTP memory 16.

Figure 2:
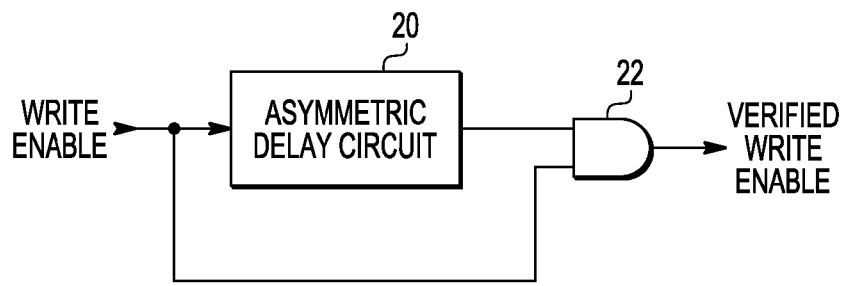
FIG. 2 illustrates in partial logic diagram form a write enable verification circuit for use in the memory system of FIG. 1.

Illustrated in FIG. 2 is an example of one form of the write enable verification circuit 14. The write enable signal is connected to an input terminal of an asymmetric delay circuit 20 and to a first input of an AND gate 22. An output of the asymmetric delay circuit 20 is connected to a second input of the AND gate 22. An output of the AND gate provides the verified write enable signal.

In operation, the asymmetric delay circuit 20 performs a delay function to delay the coupling of the write enable signal to the AND gate 22. The output of the AND gate 22 is not asserted until both the write enable signal at the first input thereof and a delayed form of the write enable signal is present at the second input of the AND gate 22. The verified write enable signal mentioned above is asserted by the AND gate 22 in response to both the write enable signal and the delayed form of the write enable signal. However, the asymmetry of the asymmetric delay circuit 20 functions to ensure that the write enable signal is not passed along to the second input of the AND gate 22 if the write enable signal does not remain asserted for a predetermined minimum amount of time, referred to as a time and voltage threshold. Therefore, if the write enable signal is a spurious signal that does not meet the time and voltage threshold, the verified write enable signal is never asserted. Thus the asymmetric delay circuit 20 functions to verify all received write enable signals and determine that the time and voltage threshold is met. Another form of asymmetry that the asymmetric delay circuit 20 provides is that a low-to-high transition of the write enable signal results in the verified write enable signal transitioning after a longer delay than a high-to-low transition relative to the write enable signal. In other words, when the write enable signal is deasserted by the OTP controller 12, the verified write enable signal is also deasserted after the signal propagation delay through the AND gate 22. The fast transition back to an unasserted verified write enable signal results from the first input of the AND gate 22 being deasserted regardless of what time it takes the asymmetric delay circuit 20 to deassert the second input of AND gate 22.

Figure 3:
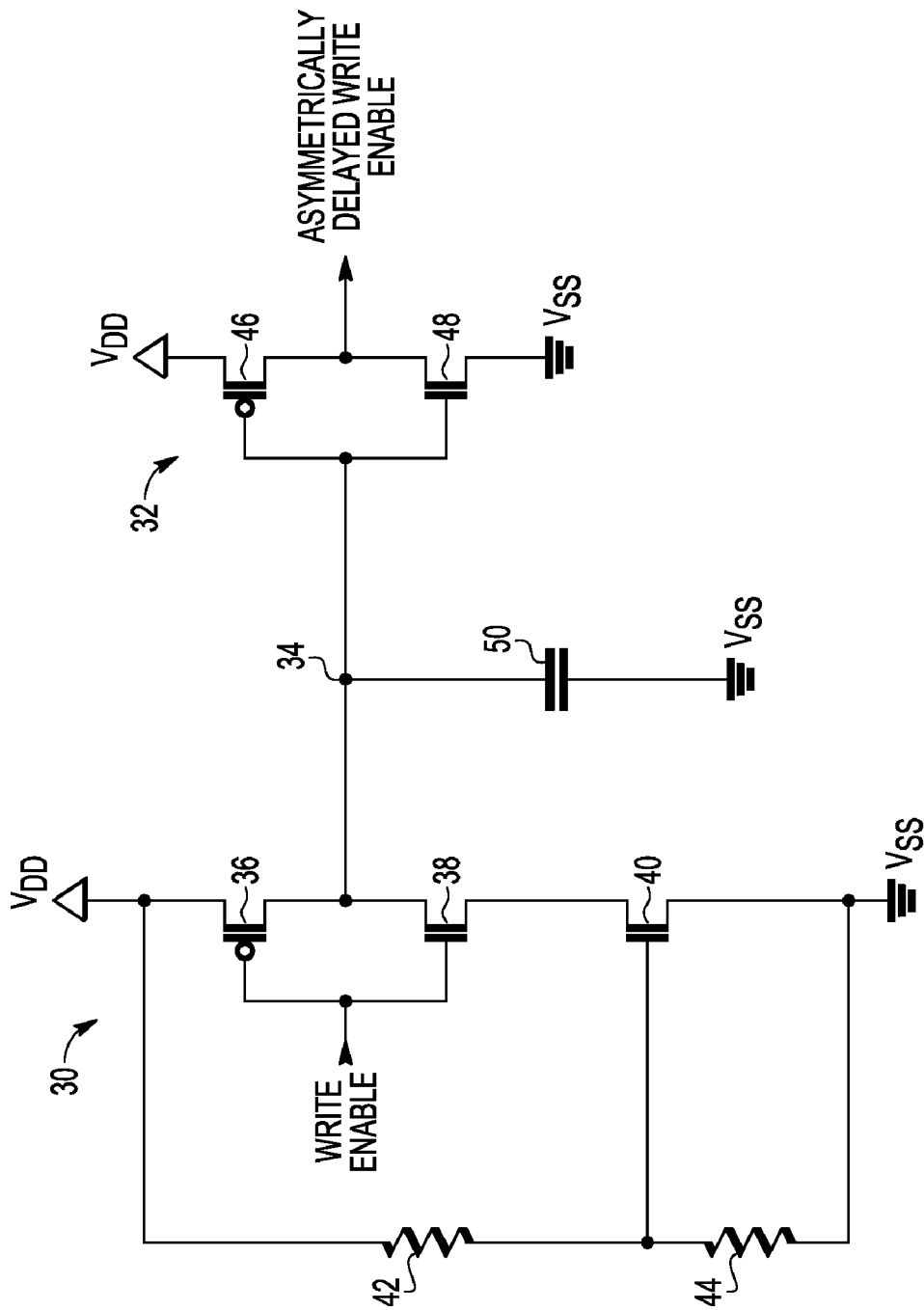
FIG. 3 illustrates in schematic diagram form an exemplary form of an asymmetric delay circuit for use in the write enable verification circuit of FIG. 2.

Illustrated in FIG. 3 is an example of one form of the asymmetric delay circuit 20. Generally the asymmetric delay circuit 20 has an asymmetric inverter stage 30 coupled to a symmetric inverter stage 32 at a capacitive node 34. The asymmetric inverter stage 30 has a P-channel transistor having a source connected to a power supply voltage terminal for receiving a supply voltage $V_{DD}$. A drain of the transistor 36 is connected to the capacitive node 34 and to a drain of an N-channel transistor 38. A gate of transistor 36 is connected to a gate of transistor 38 and receives the write enable signal. A source of transistor 38 is connected to a drain of an N-channel transistor 40. A source of transistor 40 is connected to a power supply voltage terminal for receiving a supply voltage $V_{SS}$. In one form the $V_{SS}$ voltage is an earth ground. A first terminal of a resistor 42 is connected to the $V_{DD}$ supply voltage terminal, and a second terminal of resistor 42 is connected to both the gate of transistor 40 and to a first terminal of a resistor 44. A second terminal of resistor 44 is connected to the $V_{SS}$ voltage terminal. A capacitor 50 has a first electrode connected to the capacitive node 34. A second electrode of the capacitor 50 is connected to a power supply terminal. In one form this terminal is the $V_{SS}$ voltage terminal.

Within the symmetric inverter stage 32, a P-channel transistor 46 has a source connected to the $V_{DD}$ voltage terminal, a gate connected to the capacitive node 34, and a drain for providing an asymmetrically delayed write enable signal. The asymmetrically delayed write enable signal is the signal which is connected to the second input of AND gate 22 of the programming verification circuit 14 of FIG. 2. A drain of transistor 46 is connected to a drain of an N-channel transistor 48. A gate of transistor 48 is connected to the gate of transistor 46 at the capacitive node 34. A source of transistor 48 is connected to the $V_{SS}$ voltage terminal.

In operation, the asymmetric delay circuit 20 receives the write enable signal at the gates of transistors 36 and 38. Transistors 36 and 38 invert the logic state of the write enable signal and provide an amplified inverted form at the capacitive node 34. The resistors 42 and 44 are sized so that transistor 40 is continually weakly biased in an on state. The supply voltage $V_{DD}$ is reduced by resistor 42 and applied to the gate of transistor 40. Therefore the reduced $V_{DD}$ voltage may be considered a second supply voltage. When the write enable signal is a logic low value, transistor 36 is conductive and transistor 38 is nonconductive. Therefore, capacitive node 34 is charged to the $V_{DD}$ supply voltage using capacitor 50. The symmetric inverter stage 32 inverts the logic high state at the capacitive node 34 and provides a logic low signal for the asymmetrically delayed write enable signal.

Assume now that the write enable signal transitions in logic value and becomes a logic high. This transition makes transistor 36 nonconductive and transistor 38 conductive. When transistor 38 conducts, the capacitive node 34 starts to discharge at a controlled rate through transistors 38 and 40. The symmetric inverter stage 32 has a predetermined switching level which is an input voltage level which represents when the output of the symmetric inverter stage 32 will change. If the write enable signal remains at a logic high long enough for the capacitive node 34 to transition below the switching level of the symmetric inverter stage 32, the asymmetrically delayed write enable signal will become asserted at a logic high level. If however the write enable signal does not remain at a logic high long enough, the capacitive node 34 will not transition below the switching level of the symmetric inverter stage 32 and the asymmetrically delayed write enable signal will remain unasserted. Thus, spurious signal transitions of the write enable signal which do not maintain a logic high value for a predetermined sufficient length of time will not be acknowledged as an asymmetrically delayed write enable signal. Once the write enable signal returns to a logic low state, transistor 36 will become conductive, and transistor 38 will become nonconductive. As a result, the capacitive node 34 will be charged back up to the $V_{DD}$ supply voltage very quickly. Due to this quick charging operation, a sequence of many successive spurious signal transitions of the write enable signal will not be acknowledged as an asymmetrically delayed write enable signal.

Assume now that the write enable signal is asserted long enough for the switching level of the symmetric inverter stage 32 to be crossed so that the asymmetrically delayed write enable signal is asserted. When the write enable is deasserted, transistor 36 becomes conductive and transistor 38 becomes nonconductive. This signal transistor causes capacitive node to quickly charge up to $V_{DD}$ through transistor 36. As a result, the asymmetrically delayed write enable signal transitions to a logic low value very quickly within a small recovery time. Thus, there is significant asymmetry in the amount of time that it takes the symmetric inverter stage 32 to reach a switch point in response to a low-to-high transition of the write enable signal as compared to a high-to-low transition of the write enable signal. This asymmetry is used in the context of the programming of the OTP memory 16 of FIG. 1 by the OTP controller 12 to efficiently ignore spurious signals. The spurious signals which are generated by the OTP controller 12 are short in duration and thus can be effectively eliminated from influencing the programming of the OTP memory 16. Also, it should be noted that length of the time and voltage threshold can be accurately set largely by properly sizing the capacitor 50, the gate voltage of transistor 40, and the transistors 46 and 48 of the symmetric inverter stage 32.

Illustrated in FIG. 4 is an exemplary graphical representation of signals associated with the operation of the memory system 10. The signals are represented as a function of voltage in a vertical axis and time in a horizontal axis. By way of example only, a plurality or series of short spurious signals are repetitively provided by the OTP controller 12. The cause of these spurious signals may vary as previously mentioned. For example, at a start-up of the memory system 10, unknown states are often present which can generate spurious signals. These spurious signals have a relatively short duration. Initially the capacitive node 34 is at a $V_{DD}$ value in response to the transistor 36 being conductive in response to a low write enable signal. In response to the spurious signals transitioning between high and low logic levels, the capacitive node 34 starts to discharge but is fully recharged to $V_{DD}$ due to the shortness of the spurious signals and before the capacitive node 34 is able to reach the switching level of the symmetric inverter stage 32. In response to all of the spurious signals, the asymmetrically delayed write enable signal and the verified write enable signal both remain unasserted. The plurality of spurious signals are therefore isolated from the OTP memory 16. If each spurious signal was applied to an OTP memory element within the OTP memory 16, while no single spurious signal may be long enough to inadvertently program an OTP memory element, each signal would contribute to a permanent physical modification of the OTP memory element. In one form, this physical modification can be the electro-migration of material out of a programmable layer of the OTP memory element. When enough electro-migration occurs due to the cumulative effect of a plurality of spurious signals, an inadvertent programming of the OTP memory element occurs. Several materials are used in various forms of OTP memory elements which are all susceptible to multiple short, spurious signals. Additionally, a single pulse may also cause inadvertent programming of an OTP memory element to occur.

Assume that an intentional write operation follows the spurious signals. It should be understood that in an unillustrated form the intentional write operation may be separated from the spurious signals by an intervening time when no write enable signal transitions occur. The intentional write operation has a first portion labeled "Time and Voltage Threshold" which is a verification portion in which the write enable verification circuit 14 is determining whether the write enable signal is an intentional write operation. The verification is determined by detecting that the write enable signal has had a voltage representing an asserted logic value for a sufficiently long period of time. This period of time is represented by the amount of time required for the capacitive node 34 to transition from a full rail voltage value and reach a switch point of the symmetric inverter stage 32. This period of time may vary a significant amount over a wide range of process, temperature and voltage values and thus cannot be accurately timed simply using a timer function. When the switch point is reached, both the asymmetrically delayed write enable signal and the verified write enable signal are asserted. At this point in time the feedback of the verified write enable signal from the output of the write enable verification circuit 14 to the OTP controller 12 is used to start a specified programming time for programming the OTP memory element of the OTP memory 16. The specified programming time is required to be within a specified time period in order to guarantee the correct physical modification of a given OTP memory element. The OTP controller 12, in one form, will count clock cycles beginning from the time that the feedback signal is received from the write enable verification circuit 14. Upon the expiration of that time frame, the OTP controller 12 deasserts the write enable signal. At the falling edge of the write enable signal when ending an intentional write operation, the verified write enable signal also transitions low. This circuit operation results from the first input of AND gate 22 being connected directly to the write enable signal. Within a short recovery time the voltage of the capacitive node 34 rapidly rises from near $V_{SS}$ to the switch point of the symmetric inverter stage 32. This rapid transition results from the P-channel transistor 36 being conductive and directly connecting $V_{DD}$ to the capacitive node 34. When the switch point is reached, the symmetric inverter stage 32 transitions its output signal and the asymmetrically delayed write enable transitions to a logic low within a very short recovery time after the verified write enable signal has transitioned to a logic low. The noted recovery time is much shorter in time duration than the time associated with the time and voltage threshold portion of the intentional write which is used to verify the intentional write operation. The short recovery time thus enables very closely occurring intentional write operations of OTP memory elements to occur and permits a significant reduction in OTP memory programming times. In conventional OTP memory programming operations, there is typically a need to program thousands of OTP memory elements successively. Therefore, memory system 10 permits reliable OTP memory programming and is time efficient.

By now it should be appreciated that there has been provided a memory system for OTP memory elements in an OTP memory which provides programming protection from short duration spurious signals or glitches. The memory system 10 permits asynchronous operation and has a fast recovery for an ending write enable signal transition to end an intentional write operation. The use of feedback from a write enable verification circuit to an OTP controller permits the OTP controller to accurately time a desired period to program an OTP memory element. The programming time therefore is not susceptible to significant variation resulting from variation in temperature, processing and voltage parameters.

In one form there is herein provided a memory system having a one time programmable (OTP) memory. A write enable verification circuit includes a first inverter stage and a second inverter stage coupled at a node, wherein the write enable verification circuit is configured to receive a write enable signal, and wherein the write enable signal changes from a first voltage level to a second voltage level. A voltage at the node changes at a first rate and when the write enable signal changes from the second voltage level to the first voltage level, the voltage at the node changes at a second rate higher than the first rate. The write enable verification circuit is further configured to generate a verified write enable signal for enabling programming of the OTP memory. In another form the second voltage level is greater than the first voltage level. In yet another form a capacitor has a first terminal coupled to the node and a second terminal coupled to a voltage supply terminal. In yet another form the first inverter stage has a P-channel transistor having a first current terminal coupled to a first voltage supply terminal, a control terminal coupled to receive the write enable signal, and a second current terminal coupled to the node. A first N-channel transistor has a first current terminal coupled to the node, a control terminal coupled to receive the write enable signal, and a second current terminal. A second N-channel transistor has a first current terminal coupled to the second current terminal of the first N-channel transistor, a control terminal coupled to a second voltage supply terminal, and a second current terminal coupled to a third voltage supply terminal, wherein a first voltage at the first voltage supply terminal is greater than a second voltage at the second voltage supply terminal, and wherein the second voltage is greater than a third voltage at the third voltage supply terminal. In another form the second inverter stage has a p-channel transistor having a first current terminal coupled to the first voltage supply terminal, a control terminal coupled to the node, and a second current terminal coupled to a node for providing an asymmetrically delayed write enable signal. An n-channel transistor has a first current terminal coupled to the node for providing the asymmetrically delayed write enable signal, a control terminal coupled to the node, and a second current terminal coupled to the third voltage supply terminal. In another form the write enable verification circuit further has a logical AND gate: (1) for receiving the asymmetrically delayed write enable signal and the write enable signal and (2) for providing the verified write enable signal. In another form the OTP memory has a plurality of eFuses, and the memory system further has an OTP controller, wherein the OTP controller is configured to receive the verified write enable signal and maintain the write enable signal at the second voltage level for a specified time sufficient for programming at least one of the plurality of eFuses.

In yet another form there is herein provided a memory system having a one time programmable (OTP) memory. An OTP controller is coupled to the OTP memory, wherein the OTP controller is configured to generate a write enable signal. A write enable verification circuit is coupled to the OTP memory and the OTP controller, wherein the write enable verification circuit is configured to receive the write enable signal from the OTP controller, and wherein the write enable verification circuit is further configured to generate a verified write enable signal for enabling programming of the OTP memory by the OTP controller. In yet another form the OTP memory has a plurality of eFuses, and the OTP controller is further configured to receive the verified write enable signal and in response to receiving the verified write enable signal maintain the write enable signal at a certain voltage level for a specified time sufficient for programming at least one of the plurality of eFuses. In another form the write enable verification circuit has an asymmetric delay circuit configured to delay the write enable signal. In another form the asymmetric delay circuit has a first inverter stage and a second inverter stage, wherein an output of the first inverter stage and an input of the second inverter stage are coupled at a node. In another form when the write enable signal changes from a first voltage level to a second voltage level, a voltage at the node changes at a first rate. When the write enable signal changes from the second voltage level to the first voltage level, the voltage at the node changes at a second rate higher than the first rate. In yet another form the first inverter stage has a P-channel transistor having a first current terminal coupled to a first voltage supply terminal, a control terminal coupled to receive the write enable signal, and a second current terminal coupled to the node. A first N-channel transistor has a first current terminal coupled to the node, a control terminal coupled to receive the write enable signal, and a second current terminal. A second n-channel transistor has a first current terminal coupled to the second current terminal of the first n-channel transistor, a control terminal coupled to a second voltage supply terminal, and a second current terminal coupled to a third voltage supply terminal. A first voltage at the first voltage supply terminal is greater than a second voltage at the second voltage supply terminal, and the second voltage is greater than a third voltage at the third voltage supply terminal. In another form the second inverter stage has a P-channel transistor having a first current terminal coupled to the first voltage supply terminal, a control terminal coupled to the node, and a second current terminal coupled to a node for providing an asymmetrically delayed write enable signal. An N-channel transistor has a first current terminal coupled to the node for providing the asymmetrically delayed write enable signal, a control terminal coupled to the node, and a second current terminal coupled to the third voltage supply terminal. In another form the write enable verification circuit further has a logical AND gate: (1) for receiving the asymmetrically delayed write enable signal and the write enable signal and (2) for providing the verified write enable signal.

In yet another form there is provided a memory system having a one time programmable (OTP) memory. A write enable verification circuit is coupled to the OTP memory, wherein the write enable verification circuit is configured to receive a write enable signal, and wherein the write enable verification circuit is further configured to generate a verified write enable signal for enabling programming of the OTP memory. The write enable verification circuit has a first inverter stage having an input coupled to receive the input signal and an output coupled to provide a switching voltage signal. A second inverter stage has an input coupled to receive the switching voltage signal and an output coupled to provide an output signal. The first inverter stage and the second inverter stage are configured such that the second inverter stage switches the output from a first voltage level to a second voltage level different from the first voltage level only when the input signal is maintained at a predetermined level for at least a predetermined time. In another form the memory system further has a logical AND gate: (1) for receiving the output signal of the second inverter stage and the input signal and (2) for providing the verified write enable signal. In yet another form the voltage signal at the input of the second inverter stage is initially set at a first voltage signal level. The switching voltage signal changes from the first voltage signal level to a second voltage signal sufficient to switch the output of the second inverter stage from the first voltage level to the second voltage level only when the input signal is maintained at the predetermined level for at least the predetermined time. In another form a plurality of spurious write enable signals are received as the input signal. The first inverter stage and the second inverter stage are configured such that the second inverter stage never switches the output from the first voltage level to the second voltage level different from the first voltage level regardless of how many of the plurality of spurious write enable signals are received as the input signal. In yet another form the first inverter stage and the second inverter stage are configured such that when the input signal transitions from a first voltage level to a second voltage level, the switching voltage signal changes from a first switching voltage level to a second switching voltage level in a first time period. When the input signal transitions from the second voltage level to the first voltage level, the switching voltage signal changes from the second switching voltage level to the first switching voltage level in a second time period, wherein the first time period is at least 100 times greater than the second time period.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary memory architecture, this memory architecture is presented merely to provide a useful reference in discussing various aspects of the invention. Of course, the description of the memory architecture has been simplified for purposes of discussion, and it is just one of many different types of appropriate memory architectures that may be used in accordance with the invention. Those skilled in the art will also recognize that the boundaries between logic blocks are merely illustrative and that alternative embodiments may merge logic blocks or circuit elements or impose an alternate decomposition of functionality upon various logic blocks or circuit elements.

Thus, it is to be understood that the memory system depicted herein is merely exemplary, and that in fact other memory systems can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, OTP memory 16 may be located on a same integrated circuit as the OTP controller 12 and write enable verification circuit 14 or on a separate integrated circuit.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the asymmetric delay circuit 20 may be implemented with an equivalent digital representation in which the timing functions are replaced with digital circuits such as counters and comparators. The OTP controller 12 may be implemented with various types of controllers, including a state machine or an automatic tester. Other types of memories may also benefit from the principles taught herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system comprising:
a one time programmable (OTP) memory; and
a write enable verification circuit coupled to the OTP memory including a first inverter stage and a second inverter stage coupled at a node, wherein the write enable verification circuit is configured to receive a write enable signal, and wherein when the write enable signal changes from a first voltage level to a second voltage level, a voltage at the node changes at a first rate and wherein when the write enable signal changes from the second voltage level to the first voltage level, the voltage at the node changes at a second rate higher than the first rate, and wherein the write enable verification circuit is further configured to generate a verified write enable signal for enabling programming of the OTP memory.

2. The memory system of claim 1, wherein the second voltage level is greater than the first voltage level.

3. The memory system of claim 1 further comprising a capacitor having a first terminal coupled to the node and a second terminal coupled to a voltage supply terminal.

4. The memory system of claim 1, wherein the first inverter stage comprises:
a p-channel transistor having a first current terminal coupled to a first voltage supply terminal, a control terminal coupled to receive the write enable signal, and a second current terminal coupled to the node;
a first n-channel transistor having a first current terminal coupled to the node, a control terminal coupled to receive the write enable signal, and a second current terminal; and
a second n-channel transistor having a first current terminal coupled to the second current terminal of the first n-channel transistor, a control terminal coupled to a second voltage supply terminal, and a second current terminal coupled to a third voltage supply terminal, wherein a first voltage at the first voltage supply terminal is greater than a second voltage at the second voltage supply terminal, and wherein the second voltage is greater than a third voltage at the third voltage supply terminal.

5. The memory system of claim 4, wherein the second inverter stage comprises:
a p-channel transistor having a first current terminal coupled to the first voltage supply terminal, a control terminal coupled to the node, and a second current terminal coupled to a node for providing an asymmetrically delayed write enable signal; and a n-channel transistor having a first current terminal coupled to the node for providing the asymmetrically delayed write enable signal, a control terminal coupled to the node, and a second current terminal coupled to the third voltage supply terminal.

6. The memory system of claim 5, wherein the write enable verification circuit further comprises a logical AND gate: (1) for receiving the asymmetrically delayed write enable signal and the write enable signal and (2) for providing the verified write enable signal.

7. The memory system of claim 1, wherein the OTP memory comprises a plurality of eFuses, and wherein the memory system further comprises an OTP controller, wherein the OTP controller is configured to receive the verified write enable signal and maintain the write enable signal at the second voltage level for a specified time sufficient for programming at least one of the plurality of eFuses.

8. A memory system comprising:
a one time programmable (OTP) memory;
an OTP controller coupled to the OTP memory, wherein the OTP controller is configured to generate a write enable signal; and
a write enable verification circuit coupled to the OTP memory and the OTP controller, wherein the write enable verification circuit is configured to receive the write enable signal from the OTP controller, and wherein the write enable verification circuit is further configured to generate a verified write enable signal for enabling programming of the OTP memory by the OTP controller.

9. The memory system of claim 8, wherein the OTP memory comprises a plurality of eFuses, and wherein the OTP controller is further configured to receive the verified write enable signal and in response to receiving the verified write enable signal maintain the write enable signal at a certain voltage level for a specified time sufficient for programming at least one of the plurality of eFuses.

10. The memory system of claim 8, wherein the write enable verification circuit comprises an asymmetric delay circuit configured to delay the write enable signal.

11. The memory system of claim 10, wherein the asymmetric delay circuit comprises a first inverter stage and a second inverter stage, wherein an output of the first inverter stage and an input of the second inverter stage are coupled at a node.

12. The memory system of claim 11, wherein when the write enable signal changes from a first voltage level to a second voltage level, a voltage at the node changes at a first rate and wherein when the write enable signal changes from the second voltage level to the first voltage level, the voltage at the node changes at a second rate higher than the first rate.

13. The memory system of claim 11, wherein the first inverter stage comprises:
a P-channel transistor having a first current terminal coupled to a first voltage supply terminal, a control terminal coupled to receive the write enable signal, and a second current terminal coupled to the node;
a first N-channel transistor having a first current terminal coupled to the node, a control terminal coupled to receive the write enable signal, and a second current terminal; and
a second N-channel transistor having a first current terminal coupled to the second current terminal of the first n-channel transistor, a control terminal coupled to a second voltage supply terminal, and a second current terminal coupled to a third voltage supply terminal, wherein a first voltage at the first voltage supply terminal is greater than a second voltage at the second voltage supply terminal, and wherein the second voltage is greater than a third voltage at the third voltage supply terminal.

14. The memory system of claim 13, wherein the second inverter stage comprises:
a p-channel transistor having a first current terminal coupled to the first voltage supply terminal, a control terminal coupled to the node, and a second current terminal coupled to a node for providing an asymmetrically delayed write enable signal; and
a n-channel transistor having a first current terminal coupled to the node for providing the asymmetrically delayed write enable signal, a control terminal coupled to the node, and a second current terminal coupled to the third voltage supply terminal.

15. The memory system of claim 14, wherein the write enable verification circuit further comprises a logical AND gate: (1) for receiving the asymmetrically delayed write enable signal and the write enable signal and (2) for providing the verified write enable signal.

16. A memory system comprising:
a one time programmable (OTP) memory; and
a write enable verification circuit coupled to the OTP memory, wherein the write enable verification circuit is configured to receive an input signal, and wherein the write enable verification circuit is further configured to generate a verified write enable signal for enabling programming of the OTP memory, wherein the write enable verification circuit comprises:
a first inverter stage having an input coupled to receive the input signal and an output coupled to provide a switching voltage signal, and
a second inverter stage having an input coupled to receive the switching voltage signal and an output coupled to provide an output signal, and wherein the first inverter stage and the second inverter stage are configured such that the second inverter stage switches the output from a first voltage level to a second voltage level different from the first voltage level only when the input signal is maintained at a predetermined level for at least a predetermined time.

17. The memory system of claim 16 further comprising a logical AND gate: (1) for receiving the output signal of the second inverter stage and the input signal and (2) for providing the verified write enable signal.

18. The memory system of claim 17, wherein the switching voltage signal at the input of the second inverter stage is initially set at a first voltage signal level, and wherein the switching voltage signal changes from the first voltage signal level to a second voltage signal level sufficient to switch the output of the second inverter stage from the first voltage level to the second voltage level only when the input signal is maintained at the predetermined level for at least the predetermined time.

19. The memory system of claim 16, wherein a plurality of spurious write enable signals are received as the input signal and wherein the first inverter stage and the second inverter stage are configured such that the second inverter stage never switches the output from the first voltage level to the second voltage level different from the first voltage level regardless of how many of the plurality of spurious write enable signals are received as the input signal.

20. The memory system of claim 16, wherein the first inverter stage and the second inverter stage are configured such that when the input signal transitions from a first input voltage level to a second input voltage level, the switching voltage signal changes from a first switching voltage level to a second switching voltage level in a first time period, and wherein when the input signal transitions from the second input voltage level to the first input voltage level, the switching voltage signal changes from the second switching voltage level to the first switching voltage level in a second time period, wherein the first time period is at least 100 times greater than the second time period.

* * * * *